United States Patent [19]

Rud, Jr.

[11] Patent Number: 5,022,270

[45] Date of Patent: Jun. 11, 1991

[54] EXTENDED MEASUREMENT CAPABILITY TRANSMITTER HAVING SHARED OVERPRESSURE PROTECTION MEANS

[75] Inventor: Stanley E. Rud, Jr., Eden Prairie, Minn.

[73] Assignee: Rosemount Inc., Eden Prairie, Minn.

[21] Appl. No.: 530,024

[22] Filed: May 29, 1990

[51] Int. Cl.$^5$ ............................ G01L 7/08; G01L 9/12; G01L 19/04

[52] U.S. Cl. ........................................ 73/706; 73/708; 73/718; 73/861.52; 361/283

[58] Field of Search ................... 73/706, 716, 717, 718, 73/719, 720, 721, 722, 727, 726, 861.44, 861.52, 861.61, 861.63; 338/4; 361/283; 250/231.19

[56] References Cited

U.S. PATENT DOCUMENTS

| | | | |
|---|---|---|---|
| 4,072,057 | 2/1978 | Yasuhara et al. | 73/718 |
| 4,086,815 | 5/1978 | Asano et al. | 73/721 |
| 4,135,408 | 1/1979 | Di Giovanni | 73/721 |
| 4,364,276 | 12/1982 | Shimazoe et al. | 73/721 |
| 4,370,890 | 2/1983 | Frick | 73/718 |
| 4,445,383 | 5/1984 | Binder et al. | 73/718 |
| 4,528,855 | 7/1985 | Singh | 73/721 |
| 4,574,640 | 3/1986 | Krechmery | 73/721 |
| 4,598,381 | 7/1986 | Cucci | 73/766 |
| 4,693,121 | 9/1987 | Nudd, Jr. et al. | 73/706 |
| 4,713,969 | 12/1987 | Ishii | 73/706 |
| 4,732,043 | 3/1988 | Bell et al. | 73/708 |
| 4,773,269 | 9/1988 | Knecht et al. | 73/706 |
| 4,790,192 | 12/1988 | Knecht et al. | 73/721 |
| 4,818,994 | 4/1989 | Orth et al. | 340/870.21 |
| 4,841,776 | 6/1989 | Kawachi et al. | 73/706 |
| 4,841,777 | 6/1989 | Hershey et al. | 73/721 |
| 4,909,083 | 3/1990 | Fazeli | 73/706 |
| 4,949,581 | 8/1990 | Rud, Jr. | 73/706 |

OTHER PUBLICATIONS

Yokogawa Denki Article No. A 02-06, entitled "Intelligent Transmitter Brainuni", May, 1988.

Honeywell Document 34-ST-05-01, dated 6/83 and entitled "ST 3000 Transmitter and SFC Smart Field Communicator, Theory of Operation".

Primary Examiner—Donald O. Woodiel
Attorney, Agent, or Firm—Kinney & Lange

[57] ABSTRACT

A transmitter measures pressures and has a pressure sensor and an additional pressure sensor providing additional measurement capability to the transmitter, such as an extended measurement range or measurement redundancy. Both pressure sensors share an overpressure protection device which protects them from pressures exceeding a preselected pressure limit. The pressure sensors are batch fabricated and are formed in a single piece of brittle material.

12 Claims, 5 Drawing Sheets

EXTENDED MEASUREMENT CAPABILITY TRANSMITTER HAVING SHARED OVERPRESSURE PROTECTION MEANS

This application is a continuation of application Ser. No. 07/365,922, filed June 15, 1989.

BACKGROUND OF THE INVENTION

1. Field of the Invention

The present invention relates to a transmitter having a pressure sensor for sensing pressure and an overpressure protection means for limiting the pressure applied to the pressure sensor when the applied pressure exceeds a preselected limit.

2. Description of the Prior Art

Pressure transmitters are now designed to measure process fluid pressure within a selected pressure range. Some transmitters have overpressure protection devices to prevent pressure sensors damage from pressures exceeding a preselected pressure limit. The applied pressure is connected to an isolator arrangement which uses an incompressible fluid to transfer the applied pressure to the pressure sensors. After the applied pressure reaches a preselected limit, an overpressure protection device inhibits the isolator fluid from further transfer of pressure to the sensor. However, various measurement problems still exist due to limitations of typical pressure sensors.

One limitation is that a typical pressure sensor measures pressure within a pressure range which is narrower than the desired range of measurement for many applications. While a pressure sensor's pressure measurement range (PMR) is a selected design parameter, it is not arbitrarily wide and excessive pressure causes inaccuracy or damage to the sensor. This transmitter range capability problem is generally accommodated by using multiple transmitters with overlapping ranges, with each transmitter having sensors measuring different pressure ranges. Some transmitters use multiple pressure sensors to compensate errors in the pressure measurement, without addressing the problem of transmitter range capabilities. A common implementation of multiple pressure sensors is line pressure compensation, where the measured pressure is compensated by the line pressure measurement sensed by another pressure sensor in the transmitter.

The use of multiple transmitters in some applications is complex and cumbersome, due to the loss of process time incurred when exchanging transmitters and the need to have several transmitters available at any time. Although the pressure sensor range limitation constrains any solution, a need to extend the transmitter measurement capability still exists.

SUMMARY OF THE INVENTION

The present invention relates to a transmitter with a first pressure sensor sharing an overpressure protection means with at least one additional pressure sensor which serves to extend the measurement capability of the transmitter.

The transmitter senses at least one applied pressure and comprises a first pressure sensor for sensing pressure. The invention can be practiced with a differential pressure transmitter, which senses a difference between two applied pressures, a gauge pressure transmitter wherein a pressure difference is measured between an applied pressure and a reference pressure which is usually atmospheric, and with absolute pressure transmitters, which is a type of gauge transmitter in which the reference pressure is vacuum. Various types of pressure sensors can be used in each transmitter type; some examples are those based on pressure induced changes of capacitance, resistance and resonant frequency. A differential transmitter made according to the present invention has overpressure protection means for isolatingly coupling the two pressures to a pair of separated volumes of substantially incompressible isolator fluid and to a pair of pressure inlets. The overpressure protection means limit further increase in pressure applied to the sensor by the isolator fluid when the differential pressure exceeds a preselected limit below which no sensor damage occurs. The transmitter also has at least one additional pressure sensor having a pair of additional pressure inlets, each additional inlet being open to one of the two volumes of isolator fluid so that such additional pressure sensor shares the overpressure protection means with the first pressure sensor and also provides the transmitter with an extended measurement capability.

In a first preferred embodiment, this extended measurement capability is achieved by selecting first and second sensors having pressure measurement ranges (PMR) each substantially different from the other. An example is a second pressure sensor having a second PMR wholly overlapping and extending beyond the PMR of a first pressure sensor. This type of selection scheme effectively extends the transmitter PMR through the use of additional pressure sensors, each one which has a successively wider PMR than the other extending the transmitter PMR. When a transmitter of this type senses a pressure representative of flow, a further increase in output accuracy at low flow rates is realized. Alternatively, pressure sensors having PMRs substantially the same may be used in order to provide redundancy. Redundancy ensures that critical measurements will be obtained and also provides self-correction when used in a transmitter with self diagnostics. Electronics in the transmitter condition the pressure sensor output signals to generate the transmitter output.

BRIEF DESCRIPTION OF THE DRAWINGS

FIG. 2A is a plan view of the base of the integrated sensor block shown in FIG. 2 taken about line 2a;

DETAILED DESCRIPTION OF THE PREFERRED EMBODIMENTS

Figure 1:
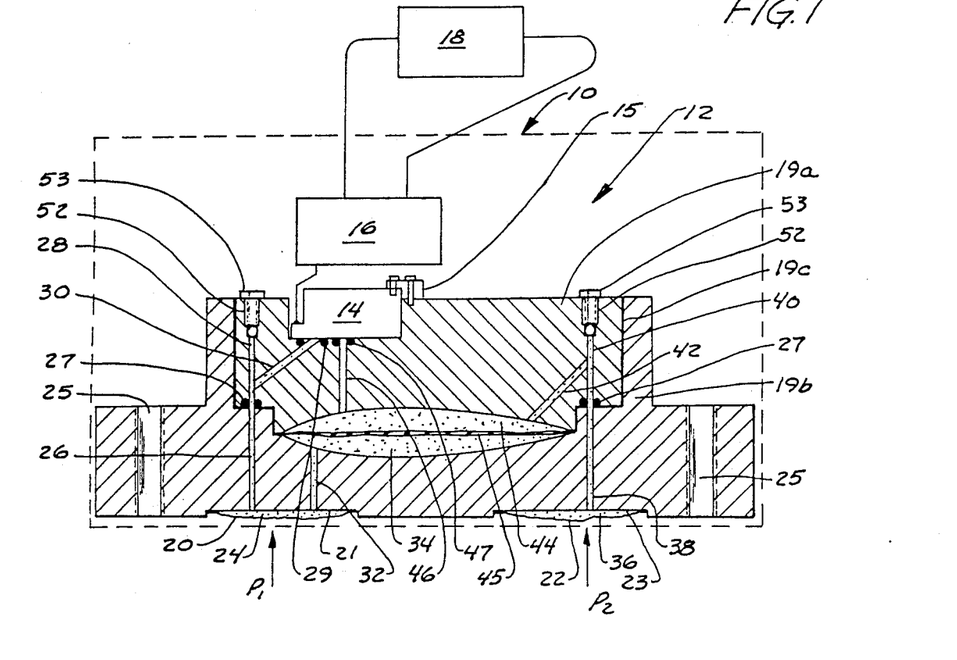
FIG. 1 is a part schematic, part cross-sectional view of a differential pressure transmitter made according to the present invention and having a multiple sensor assembly.

In FIG. 1, a differential pressure transmitter 10 measures a difference between two applied pressures $P_1$ and $P_2$ pressurizing an overpressure protection device 12. The overpressure protection device 12 couples the two applied pressures to pressure sensors in a multi sensor assembly 14 and protects the multi sensor assembly 14 when differential pressures greater than a preselected limit are applied. Use of the shared overpressure protection device 12 avoids the need for integral overpressure protection in each pressure sensor in the sensor assembly 14. Clamp 15 clamps the overpressure protection device 12 and the multi sensor assembly 14 together. The electrical output from the multi sensor assembly 14 is connected to control electronics 16, which controls the sensor output in a known manner and provide output representative of the differential pressure to a loop 18, typically signalling according to a two-wire current loop (e.g. 4-20 mA) communication standard.

Overpressure protection device 12 is formed of an upper section 19a and a lower section 19b which are joined along an interface 19c using gold o-rings 27,27 or other suitable seals. The lower section 19b has two threaded holes 25,25 for mounting. In the upper section 19a, the deflection of isolator diaphragm 20 by the applied pressure $P_1$ pressurizes the volume of substantially incompressible isolator fluid 24, transmitting the pressure to multi sensor assembly 14 via passageways 26, 28 and 30 and to an overpressure cavity 34 via passageway 32. In like fashion, isolator diaphragm 22 couples applied pressure $P_2$ through a volume of substantially incompressible fluid 36 to an overpressure cavity 44 via passageways 38,40 and 42 and to multi sensor assembly 14 via passageway 46. The size and thickness of the isolator diaphragms 20 and 22 are selected to be highly compliable within the desired PMR. Gold o-rings 29 and 47 or other suitable seals seal passageways 30 and 46 to the inlets of multi sensor assembly 14. Pressure difference between the two volumes of isolator fluid 24 and 36, which are introduced into the upper section 19a at two openings 52,52 sealed by ball and screw combinations 53,53 deflects an overpressure diaphragm 45 separating the pair of overpressure cavities 34 and 44. The volumes of the two isolator fluids 24 and 36 are approximately equalized to lessen transmitter errors due to fluid expansion mismatch, since some isolator fluids increase approximately 20% in volume over a temperature range of $-40$ to 125 degrees Centigrade. The fluid volumes are preferably chosen so that at low temperatures, the isolator diaphragms do not bottom against the isolator diaphragm supports when the difference between the applied pressures is within a preselected pressure limit. Accordingly, the fluid volume must be selected so that its expansion at high temperature does not apply excessive pressure to the inner major side of the isolator diaphragms, distending them and introducing measurement errors. When differential pressures exceeding a preselected differential pressure limit are applied to the transmitter 10, enough isolator fluid 24 or 36 is displaced into or out of the overpressure cavities 34 and 44 to substantially fully support the isolator diaphragms 20 or 22 against isolator diaphragm supports 21 or 23, inhibiting transfer of the applied pressure to the multi sensor assembly 14. For example, when the pressure $P_1$ exceeds pressure $P_2$ by more than the preselected differential pressure limit, the deflection of isolator diaphragm 20 displaces enough isolator fluid 24 into the overpressure cavity 34 to allow the isolator diaphragm 20 to bottom against the isolator diaphragm support 21. After the isolator diaphragm 20 bottoms, further increases in P1 cannot be transmitted to the isolator fluid 24 and the fluid forced out of the other cavity 44 deflects the isolator diaphragm 22 outward.

Figure 2:
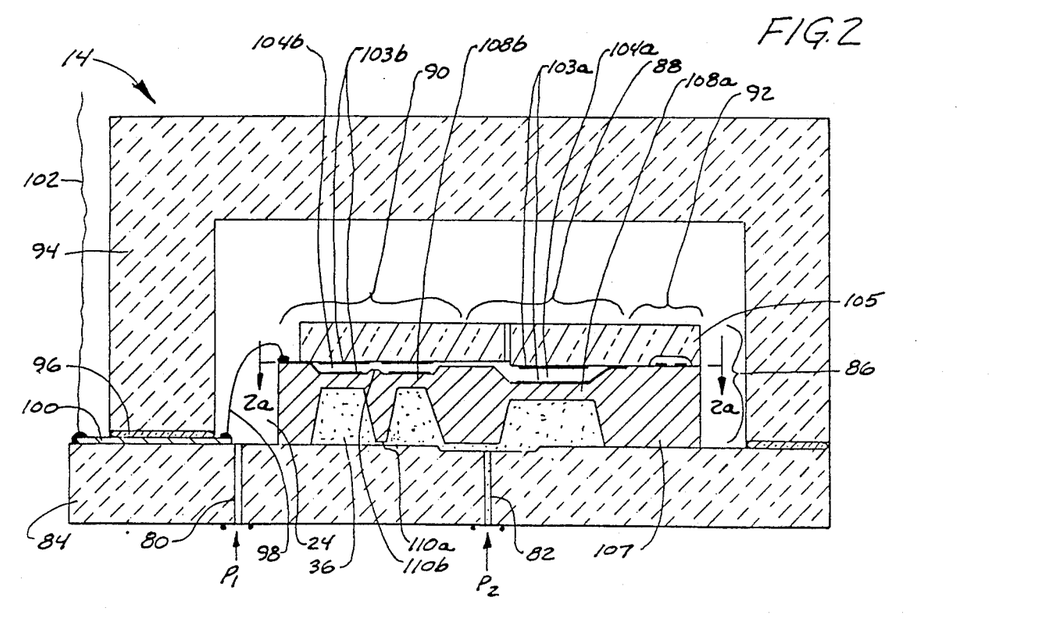
FIG. 2 is a cross-sectional view of a multi sensor assembly use in the transmitter shown in FIG. 1.

A first preferred embodiment of the multi sensor assembly 14 of FIG. 1 is shown in FIG. 2. Pressure inlets 80 and 82 in a ceramic header 84 couple incompressible isolator fluids 24 and 36 to the integrated sensor block 86 made of a silicon base 107 and a glass cap 105 sealed together. The integrated sensor block 86 comprises a differential pressure sensor 88, an additional pressure sensor 90 and a temperature sensor 92. The temperature sensor 92 measures temperature near the differential pressure sensors 88 and 90 and the electronics 16 uses its output to compensate temperature induced pressure sensor errors in a known manner. A ceramic cap 94 is joined to the ceramic header 84 by suitable means such as glass frit seal 96. A metal feedthrough 100 is deposited under the glass frit seal 96 to connect electrical signals from the integrated sensor block 86 to the exterior of the sealed multi sensor assembly 14. Ball bonded wire bundles 98 and 102 or other connective devices conduct electrical signals from the integrated sensor block 86 to the metal feedthrough 100 and from there to the electronics 16. The electronics 16 combines the outputs of the pressure sensors 88 and 90 to provide a single improved output representing differential pressure. In a first configuration when sensors have substantially the same PMR, the output can be an average of the two sensed pressures, provided that the two sensed pressures have substantially the same value. In such case, when the two sensed pressures are markedly different values, the transmitter can provide an output signal indicating a transmitter malfunction, e.g. 25 mA output when the signalling method employs a 4-20 mA current loop communications standard. In a second configuration, the pressure sensors have PMRs different from one or each other and can be arranged in order of successively widening PMRs. The sensor having the narrowest PMR is the most accurate pressure sensor and the sensor having the widest PMR is the sensor with the least accuracy. The PMR of the transmitter is the same as the PMR of the sensor having the widest PMR. The PMR of a sensor having a wider PMR than another sensor wholly overlaps and extends beyond the upper range limit (URL) of the other pressure sensor. In such a transmitter with two sensors, the electronics select the output of the more accurate sensor, which has the narrower PMR, for conversion to transmitter output at pressures within the PMR of the most accurate sensor. When the transmitter measures pressures between the most accurate pressure sensor URL and the transmitter URL, the electronics select the output of the pressure sensor with the widest range for conversion to transmitter output. In this way, the electronics select the most accurate pressure sensor output at a given measured pressure. Each of these configurations can be utilized separately or simultaneously.

The differential pressure sensors 88 and 90 are capacitive pressure sensors fabricated of a brittle material such as silicon. This embodiment uses batch fabrication, where multiple sensors are fabricated simultaneously on a single substrate of brittle material. Usually multiple substrates are processed together in a group, typically resulting in a lower cost of fabrication than if each sensor were fabricated singly. An advantage of this manufacturing technique is to ensure that processing variations between groups of substrates are small, promoting tight control over sensor specifications. A further advantage is that the two pressure sensors 88 and 90 are adjacent to each other on the silicon base 107, so that the amount of process variation between these batch fabricated sensors is smaller than the process variations for two other pressure sensors far apart on the substrate. In particular, photolithographic variations which affect dimensions of components, film thicknesses variations which affect parameters such as metal plate spacing or resistivity of conductors and doping uniformity variations which affect component resistivity, are all contributing factors to overall variation in sensor performance. Process variations are usually non-uniform across the substrate and depend on the type of processing equipment and sequence.

Figure 2A:
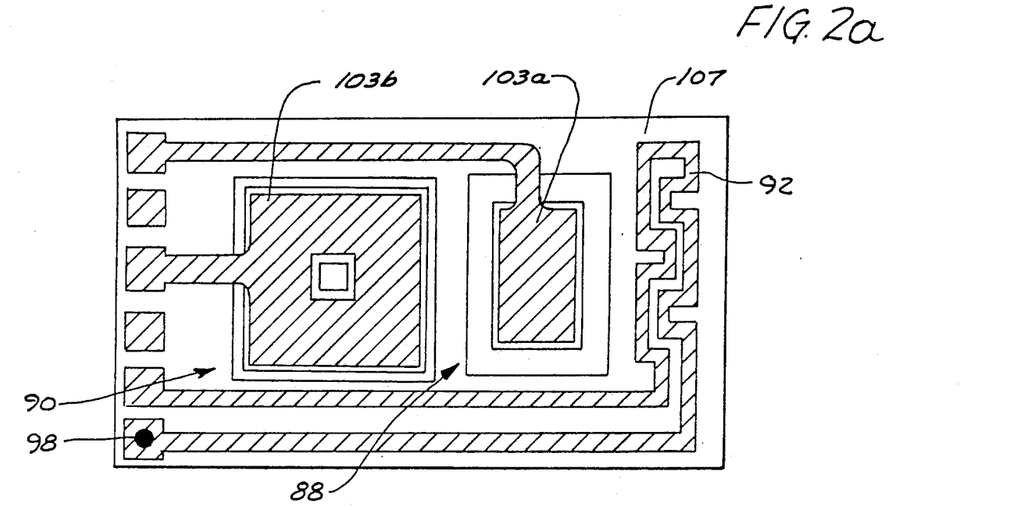

The capacitive sensing functions of pressure sensor 88 and 90 are performed by two pairs of metal electrodes 103a,103b, deposited on opposite facing sides of two cavities 104a,104b, respectively forming a capacitor in each of the differential pressure sensors 88 and 90. The difference in pressure between isolator fluid 24 and 36 deflects the diaphragms 108a,108b, changing the spacing in each pair of metal electrodes 103a,103b and effecting a change in capacitance. The additional differential pressure sensor 90 measures a narrower range of differential pressures than differential pressure sensor 88 and has bidirectional overpressure stops 110a,110b for protection from higher pressures measured by the differential pressure sensor 88. FIG. 2A is a plan view of the silicon base 107, showing the metal electrodes 103a,103b and the temperature sensor 92.

Figure 3A:
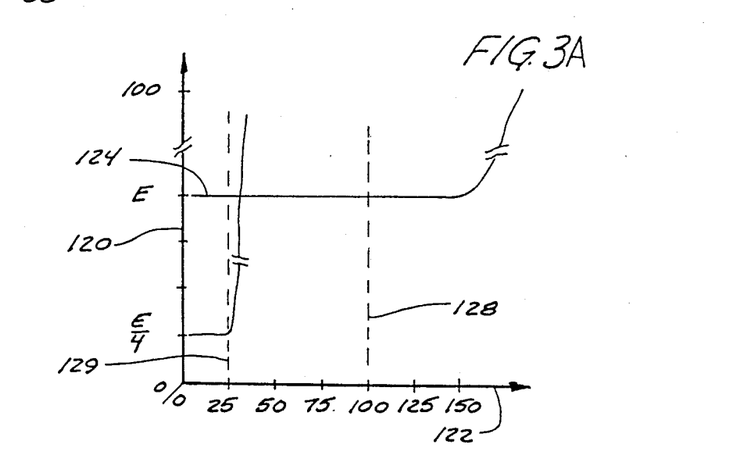
FIGS. 3A and 3B are plots representing transmitter errors plotted as a function of pressure as a percentage of PMR.

In FIG. 3A, typical maximum non-correctable error of the outputs of the two differential pressure sensors 88 and 90 as a function of the PMR of transmitter 10 is shown. The vertical axis 120 shows maximum noncorrectable sensor error as a percentage of the URL of transmitter 10 and the horizontal axis 122 shows applied pressure as a percentage of the PMR of transmitter 10. The maximum non-correctable error of differential pressure sensor 88, represented at line 124, intercepts the vertical axis at E. The PMR of this sensor is substantially the same as the transmitter 10 PMR, represented at the 100% on line 128. The maximum noncorrectable error for additional differential pressure sensor 90, represented at line 126, intercepts the vertical axis at E/4 and its PMR extends to 25% of the URL of transmitter 10, represented at line 129. The maximum non-correctable error is substantially independent of pressure and is proportional to the sensor's URL. Because the pressure sensor 88 has a PMR four times larger than that of pressure sensor 90, the maximum noncorrectable error is four times larger as well. In other words, a sensor having a wide measurement range has more non-correctable error than a sensor having a narrower measurement range. The transmitter 10 maximum noncorrectable error combines the error characteristics of the two sensors and is shown in FIG. 3B.

Figure 3B:
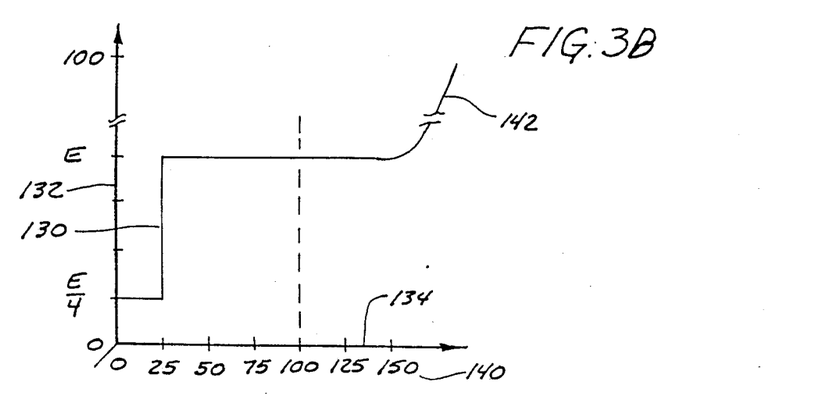

In FIG. 3B, the maximum non-correctable transmitter 10 error, represented at line 130, is reported as a percentage of transmitter URL on the vertical axis 132 and applied pressure as a percentage of PMR of transmitter 10 on the horizontal axis 134. Added transmitter capability is demonstrated because of the fourfold decrease in maximum errors during approximately the first 25% of the transmitter 10 PMR, contributed by the additional differential pressure sensor 90.

Consider an example where differential pressure is applied to transmitter 10 and increased from the lower to the upper (100%) transmitter range limits, corresponding to traversing the horizontal axis of FIG. 3B from left to right. The electronics 16 conditions the output of each sensor output to substantially remove correctable errors such as differential pressure non-linearity, line pressure non-linearity and temperature related non-linearities, leaving non-correctable errors such as noise and both pressure and temperature hysteresis. Conditioned output from additional differential pressure sensor 90 is selected and converted to the output of transmitter 10 until the end of that sensor's URL is reached, corresponding to the 25% mark on the horizontal axis. At this point, electronics 16 selects and converts the output of the differential pressure sensor 88 as the transmitter 10 output. In this configuration of pressure sensors, the electronics select the output of the most accurate sensor at a given pressure. At some specified point after the initial 25% of the PMR of transmitter 10, the overpressure limit of the additional differential pressure sensor 90 is exceeded and one of the sensor's overpressure protection stops 110a or 110b is engaged to prevent further deflection of the diaphragm 108b. This is different than the overpressure protection for the transmitter, which protects all the sensors in the transmitter by bottoming an isolator diaphragm against an isolator diaphragm support.

In summary, there is an added capability in transmitter 10 because the maximum non-correctable error during the first 25% of the transmitter 10 PMR is four times less than the maximum non-correctable error during the remainder of the transmitter 10 range. This is important for pressure measurements close to the transmitter's lower range limit, since error as a percentage of measurement becomes larger as the pressure approaches the lower range limit. From FIG. 3B, the extended measurement capability is expressed alternatively by noting that the presence of differential pressure sensor 88 extends the transmitter PMR, although at the expense of higher levels of error.

Figures 4A, 4B, 4C:
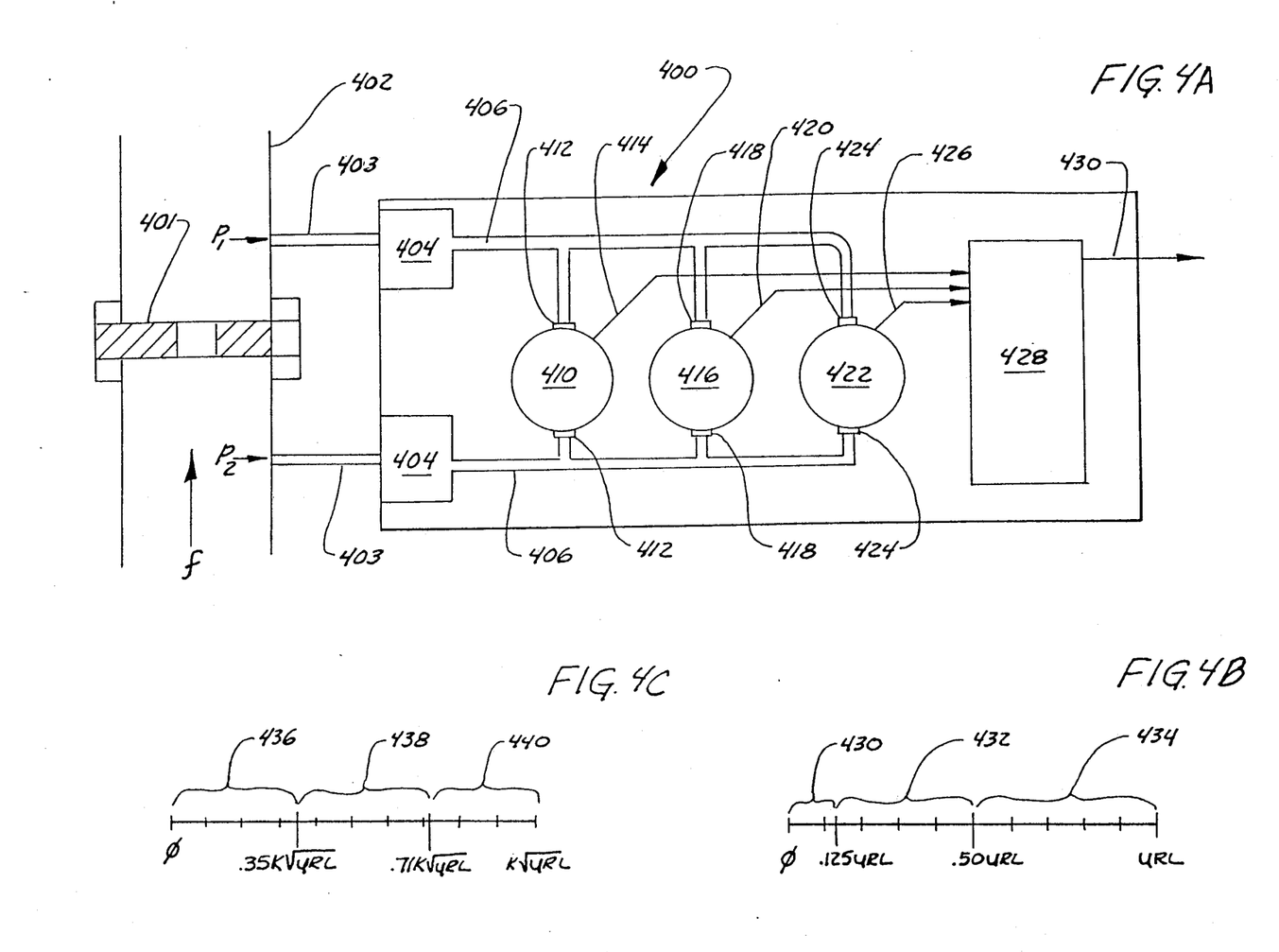
FIG. 4A is a part schematic, part cross-sectional view of a differential pressure transmitter made according to the present invention and used in a flow measurement application.
FIG. 4B is a graph representing pressure as a percentage of measurement range for the transmitter in FIG. 4A.
FIG. 4C is a graph representing flow as a percentage of measurement range for the transmitter in FIG. 4A.

An alternative method of extending the measurement capability of the transmitter 10 is to incorporate at least two pressure sensors having substantially the same PMR in the transmitter 10. The transmitter 10 span is unaffected and the level of accuracy throughout the PMR is constant. However, this redundancy extends the measurement capability of the transmitter 10 by providing extra security for critical measurements and transmitter self-correction features. In FIG. 3B, a preselected pressure limit of transmitter 10 is shown as 150% of the transmitter's PMR at 140, and is chosen such that all structural damage occurs at applied differential pressures higher than the limit. In FIG. 3B, maximum non-correctable error increases steadily at pressures exceeding the transmitter overpressure limit, represented by line segment 142. The transmitter 10 operates according to a known set of specifications before and after applications of pressures exceeding the preselected limit. The specifications are furnished by the manufacturer or seller and usually employ specifications defined according to Scientific Apparatus Makers Association (SAMA) Process, Measurement and Control (PMC) 20.1-1973, a document for process measurement control terminology and tested to methods defined in Generic Test Methods document SAMA PMC 31.1-1980. The criteria for selection of such limits as well as methods of extending transmitter measurement capability apply equally well to other types of transmitters such as gauge or absolute FIG. 4A shows a transmitter represented by functional block 400 measuring applied pressure $P_1$ and $P_2$ through taps 403,403, located upstream and downstream from a flow restriction 401 in a pipe 402. The flow in pipe 402, represented by an arrow f, is substantially proportional to the square root of the difference between $P_1$ and $P_2$. The two pressures deflect isolator diaphragms, represented by functional blocks 404,404, which cause two separated volumes of substantially incompressible isolator fluid 406,406 to pressurize and transmit the applied pressure to pressure sensors in the transmitter 400. A first pressure sensor 410 has a pair of pressure inlets 412,412 open to the pair of separated volumes of isolator fluid 406,406 and provides an output signal representative of the applied differential pressure, represented at line 414. There is an additional pressure sensor 416 having a pair of pressure inlets 418,418 open to the volumes of isolator fluid 406,406, designed to have a PMR of one half that of the first pressure sensor 410 and an output signal representative of the applied differential pressure, represented at line 420. The remaining additional pressure sensor 422 also has a pair of pressure inlets 424,424 open to the volumes of isolator fluid 406,406, a PMR of 25% that of additional pressure sensor 416 and output 426 representative of the applied differential pressure. As discussed earlier, the pressure sensor having the narrowest PMR, or equivalently the additional pressure sensor 422, has the least maximum non-correctable error. The electronics 428 selects the most accurate of the pressure sensor outputs 426, 420 and 414, converting them to output 430 representing either flow in the pipe 402 or the applied differential pressure across the orifice 401.

Pressure transmitter 400 measures flow in process control. For the same transmitter, the percentage of flow measurement range affected by increased accuracy of additional pressure sensors is larger than the percentage of pressure measurement range affected by the same additional pressure sensors in a pressure measurement application. The difference is attributable to the nonlinear relationship between flow and pressure. FIGS. 4B and 4C show the percentage of measurement range affected by the additional pressure sensors 416,422 in pressure and flow measurements, respectively.

FIG. 4B shows differential pressure as a percentage of transmitter 400 PMR, extending from zero to the URL applied pressure. Additional pressure sensor 422 output represented at line 426, is selected for conversion to transmitter 400 output in the range indicated at 430 between zero applied pressure and .125URL. Additional pressure sensor 416 output, represented at line 420, is selected for conversion to transmitter 400 output in the range indicated at 432 between .125URL and .50URL. Finally, first pressure sensor 410 output, represented by line 414, is selected for conversion to transmitter 400 output for range indicated at 434 of the transmitter measurement range. The additional pressure sensors provide increased accuracy throughout 50% of the flow measurement range.

FIG. 4C shows flow as a percentage of transmitter 400 flow measurement range. Using the proportionality of flow to the square root of pressure given by $$f = k(P)^{1/2}$$

where f is flow, k is a proportionality constant and P is the difference between $P_1$ and $P_2$. The range of additional pressure sensor 422, indicated at 430 is expanded to the range indicated at 436 between zero and $.35k(URL)^{1/2}$. In like fashion, the range of additional pressure sensor 416, indicated at 432, is expanded to the range indicated at 438 between $.35k(URL)^{1/2}$ and $.71k(URL)^{1/2}$. Finally, the range of remaining first pressure sensor 410, indicated at 434, becomes the flow measurement range indicated at 440 between $.71k(URL)^{1/2}$ and $k(URL)^{1/2}$. Increased accuracy is achieved throughout 71% of the flow measurement range, as contrasted to 50% of the pressure measurement range of FIG. 4B.

In summary, the improved transmitter displays a higher percentage of accuracy as a percentage of measurement range in a flow measurement application than in a pressure measurement application.

Figure 5:
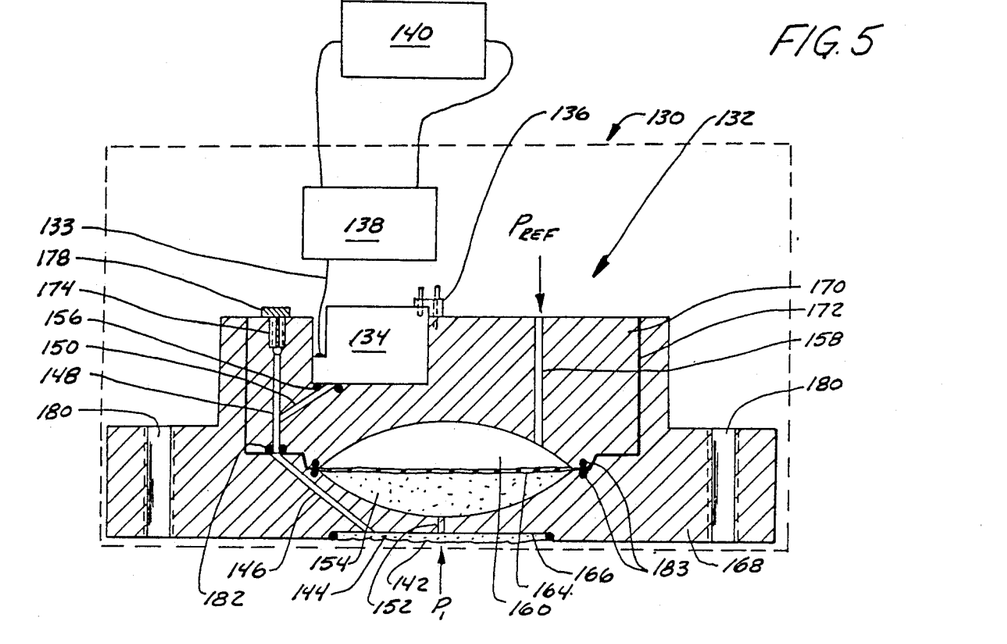
FIG. 5 is a part schematic, part cross-sectional view of a gauge or absolute pressure transmitter made according to the present invention.

In FIG. 5, a gauge pressure transmitter 130 measuring a difference between an applied pressure $P_1$ and a gauge reference pressure, $P_{ref}$, is shown. The pressure $P_1$ acts on the overpressure protection device 132 which couples the applied pressure to pressure sensors in a multi sensor assembly 134. A clamp 136 or other appropriate hardware fixes the multi sensor assembly 134 to the overpressure protection device 132. Outputs indicated at 133 electrically connect the multi sensor assembly 134 to electronics 138. The electronics 138 operates on the output in a known manner and provide output representative of the applied gauge pressure to a loop 140, typically signalling according to a two-wire 4-20 mA communication standard.

The overpressure protection device 132 is formed in lower section 168 and upper section 170 of stainless steel or some other material providing structural integrity and joined along an interface 172. The upper section 170 is sealed to the lower section 168 using gold o-ring 182,183,183 or other suitable seal. A volume of substantially incompressible isolator fluid 144 enters the overpressure protection device 132 at casting opening 174 sealed by a ball and screw combination 178 or other suitable seal. The lower section 168 has two threaded holes 180,180 for mounting. Applied pressure P deflects the isolator diaphragm 142 of the overpressure protection device 132. Such deflection pressurizes the isolator fluid 144 filling passageways 146, 148 and 150 which couple pressure to the multi sensor assembly 134 and also filling passageway 152, which couples pressure to an overpressure cavity 154. A gold o-ring seal 156 or other suitable hardware seals passageway 150 to the multi sensor assembly 134. A passageway 158 connects the gauge reference pressure, $P_{ref}$, to an overpressure cavity 160. The reference pressure is sometimes changed from gauge pressure to substantially vacuum pressure and an absolute pressure measurement is made. The absolute pressure measurement requires no additional hardware and is a typical modification made to a gauge pressure transmitter by workers in this field. The pressure difference between the volume of isolator fluid 144 and the reference gauge pressure, $P_{ref}$, deflect an overpressure diaphragm 164 separating the two overpressure cavities 154 and 160. When the difference between $P_1$ and the gauge reference pressure, $P_{ref}$, exceeds a preselected gauge pressure limit, the overpressure protection device 132 inhibits transfer of the applied pressure to the multi pressure assembly 134 by displacing enough isolator fluid 144 into the overpressure cavity 154 to substantially fully support the isolator diaphragm 142 against isolator diaphragm support 166. Accordingly, the overpressure cavity 154 must accommodate the volume of isolator fluid 144 normally lying behind the isolator diaphragm 142 when an overpressure condition occurs.

Figure 6:
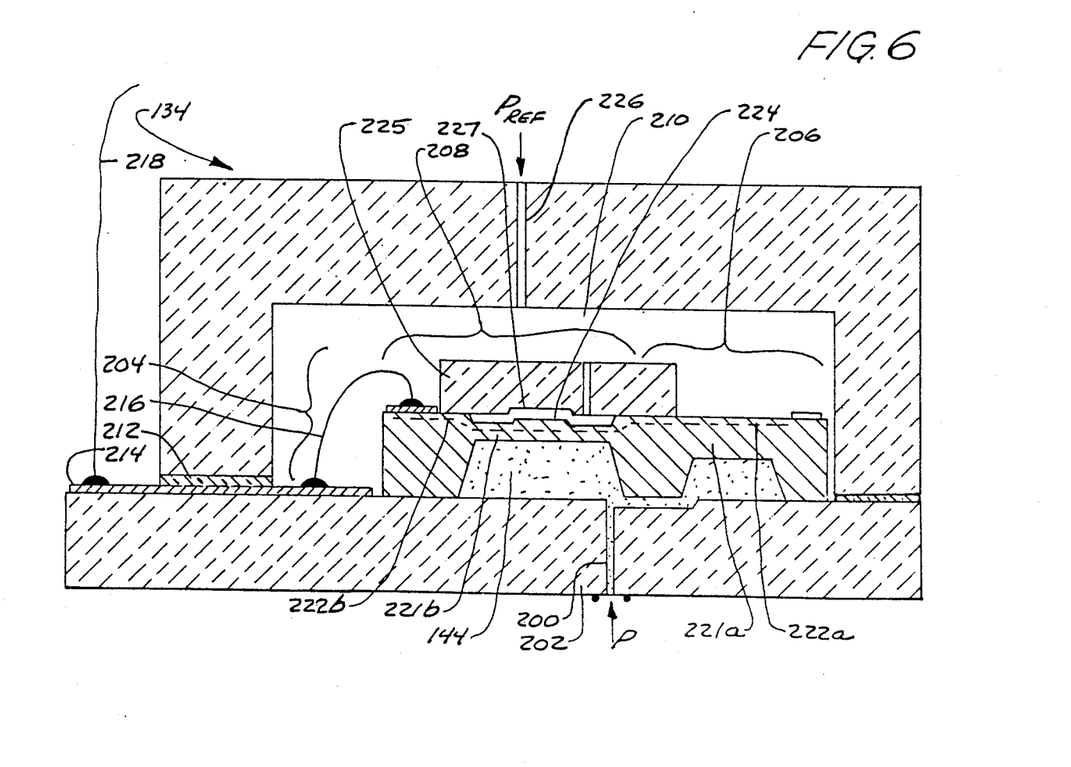
FIG. 6 is a cross sectional drawing of a multi sensor assembly used in the transmitter and shown in FIG. 5 and; 1

In FIG. 6, a first preferred embodiment of the multi sensor assembly 134 is shown. A pressure inlet 200 in a ceramic header 202 provides passage for the pressurized isolator fluid 144 from passageway 150 into an integrated sensor block 204 comprising a gauge pressure sensor 206 and an additional gauge pressure sensor 208. A ceramic cap 210 is joined to the ceramic header 202 by suitable means such as glass frit seal 212. A metal feedthrough 214 is deposited under the glass frit seal 212 to connect electrical signals from the integrated sensor block 204 to the exterior of the sealed multi sensor assembly 134. Ball bonded wire bundles 216 and 218 or other similar conductive devices connect the electrical signals from the integrated sensor block 204 to the metal feedthrough 214 and from there to the electronics 138.

Integrated sensor block 204 comprises gauge pressure sensors 206 and 208, which sense pressure by means of piezoresistive strain gauges 222a,222b, formed by diffusion, implantation or other known manner of dopant introduction on sensing diaphragms 221a,221b for gauge pressure sensors 206,208, respectively. Other pressure sensing mechanisms such as changes in capacitance, resonant frequency or polarization of light may be used and various versions of all four mechanisms are known. A passageway 226 in the ceramic cap 202 introduces the gauge reference pressure, $P_{ref}$, to the gauge pressure sensors 206 and 208, the difference between the gauge reference pressure and the isolator fluid 144 pressure deflecting and stressing the sensing diaphragms 221a,221b.

Gauge pressure sensor 206 measures a wider span of pressures than additional gauge pressure sensor 208, necessitating a unidirectional pressure stop 224 to protect the latter pressure sensor against pressures measured by the former even though the maximum deflection of most piezoresistive strain gauges is on the order of one to five microns Permanent degradation in sensor performance will typically occur after application of pressures exceeding five times the highest specified pressure the sensor measures. This guideline applies for the sensor types discussed in this application, and preselected pressure limits are set accordingly so that the overpressure protection device protects the sensors from these pressures. The unidirectional overpressure stop 224 is a silicon boss which bottoms against an inner surface of a depression 227 formed in an upper glass support 225. As in the preferred embodiment of the differential transmitter shown in FIG. 1, this additional gauge pressure sensor 208 extends the measurement capability of the gauge transmitter 130 by increasing transmitter accuracy throughout the lower regions of the transmitter span.

Figure 7:
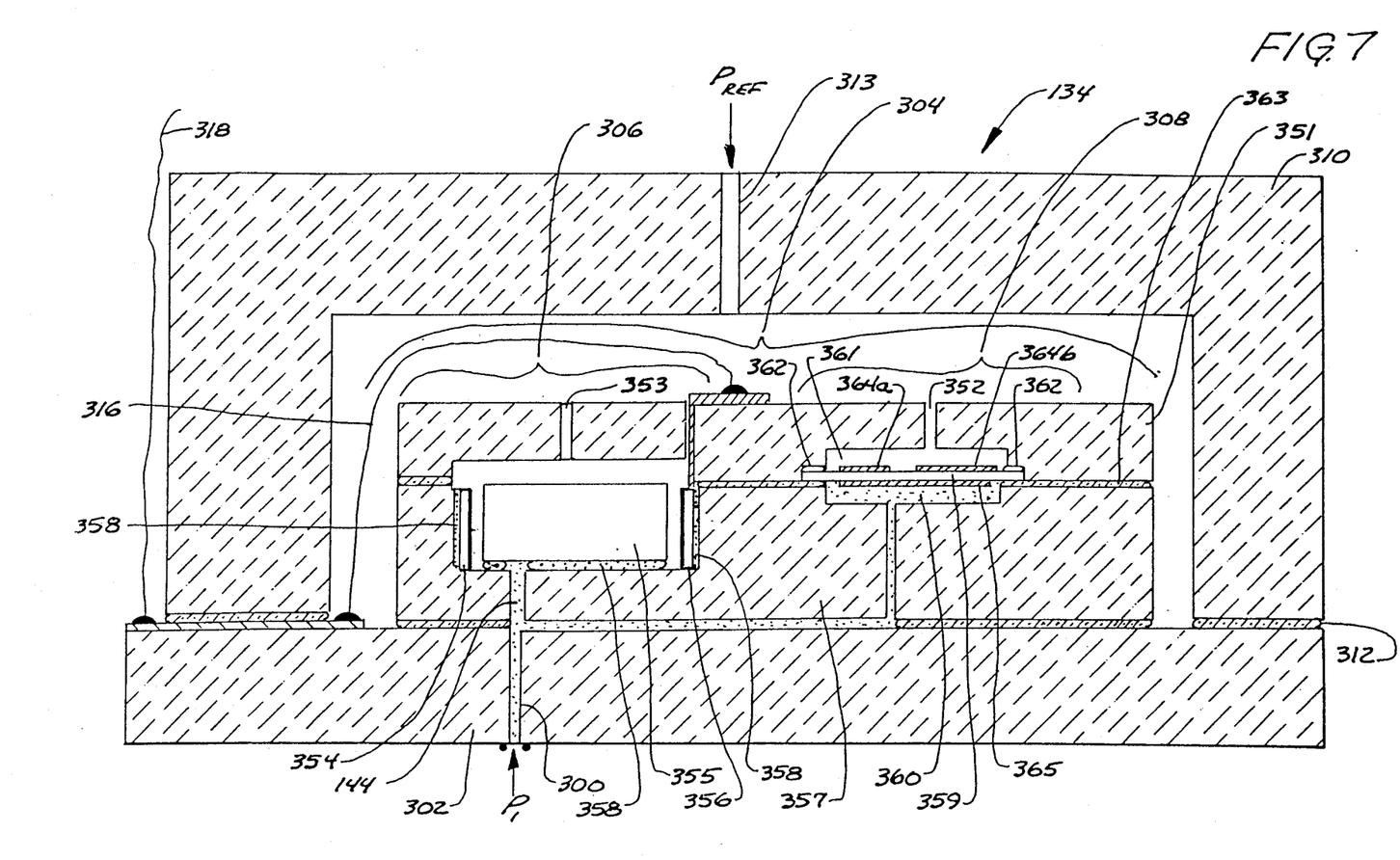
FIG. 7 is a cross sectional drawing of an alternate multi sensor assembly used in the transmitter in FIG. 1 and shows an optical and piezoelectric membrane pressure sensor.

In FIG. 7, an alternate multi sensor assembly 134 for the gauge transmitter 130 explained in FIG. 5 is shown. A pressure inlet 300 in a ceramic header 302 provides for passage of the isolator fluid 144 into an integrated sensor block 304 comprising a gauge pressure sensor 306 and an additional gauge pressure sensor 308. A ceramic cap 310 is joined to the ceramic header 302 by suitable means such as glass frit seal 312. A passageway 313 allows the gauge reference pressure, $P_{ref}$, to access the two gauge pressure sensors 306 and 308. A metal feedthrough 314 is deposited under the glass frit seal 312 to connect electrical signals from the integrated sensor block 304 to the exterior of the sealed multi sensor assembly 134. Ball bonded wire bundles 316 and 318 or similar conductive devices connect the electrical signals from the integrated sensor block to the metal feedthrough 314 and from there to the electronics 138.

The integrated sensor block 304 comprises an upper section 351 and a lower section 357. Two passageways 353,352 couple the gauge reference pressure, $P_{ref}$, to the gauge pressure sensor 306 and the additional gauge pressure sensor 308, respectively. The gauge pressure sensor 306 is an optical pressure sensor and has a light source 354, an elastomeric crystal 355 which polarizes light as a function of the pressure applied to the crystal and a light receiver 356, all affixed to the lower section 357 by glass frit seals 358,358,358. The additional gauge pressure sensor 308 has a piezoelectric crystal 359 bridging a depression 360 in the lower section 357 of the integrated sensor block 304. A corresponding recess 361 in the upper section 351 fits over the piezoelectric crystal 359 and glass frit seals 362,362 secure the crystal to the upper section. Another glass frit seal 363 seals both the piezoelectric crystal 359 to the lower section 357 and the upper section 351 to the lower section 357. Two electrical signals of opposite phase having appropriate frequency are connected to two metallized areas 364a,364b on one side of the crystal. The crystal resonates as a function of applied frequency and pressure, and metallized area 365 on the other side of the crystal conducts this signal via ball bonded wires to the exterior of the sealed multi sensor assembly 134.

The PMR of additional gauge pressure sensor 308 is four times smaller than the PMR of gauge pressure sensor 306. Because maximum non-correctable errors are substantially independent of pressure and are proportional to the sensor's URL, the wider PMR of gauge pressure sensor 306 has more error than the narrower PMR of additional gauge pressure sensor 308. A graph of the maximum non-correctable error of transmitter 130 versus the transmitter 130 PMR is similar to the graph shown in FIGS. 3A and 3B, since the additional gauge pressure sensor 308 extends the measurement capability of the transmitter 130 by increasing accuracy at low pressure measurements. The extended measurement capability is alternatively expressed by noting that the presence of gauge pressure sensor 306 extends the transmitter 130 PMR, although at the expense of higher levels of error.

I claim:

1. A transmitter sensing at least one applied pressure and providing output representative of the applied pressure, comprising:

a pressure sensor having an output and at least one inlet and sensing pressures within a first pressure measurement range;

a pressure sensor having an output and at least one inlet and sensing pressures within a first pressure measurement range;

overpressure protection means for coupling the applied pressure to the pressure sensor inlet including means for containing a volume of substantially incompressible isolator fluid leading to the pressure inlet, the applied pressure causing a movable member to act on the isolator fluid as applied pressure changes, the overpressure protection means including a chamber which changes in volume as applied pressure changes to permit the movable member to contact a stop, limiting further increase in fluid pressure acting at the sensor inlet when the applied pressure exceeds a preselected limit;

at least one additional pressure sensor sensing pressures within an additional pressure measurement range and having an additional sensor output and a pressure inlet open to the volume of isolator fluid so that the overpressure protection means is shared by both pressure sensors; and electronics means for combining the sensor outputs for conversion to the transmitter output.

2. The transmitter as recited in claim 1 where the transmitter senses pressures within a transmitter pressure measurement range and the additional pressure measurement range extends beyond and substantially includes the first pressure measurement range, and the electronics means further comprises means for operating on the sensor outputs such that when the applied pressure exceeds pressures within the first pressure measurement range, the additional pressure sensor output is selected for conversion to the transmitter output.

3. The transmitter as recited in claim 1 where at least one additional pressure measurement range is substantially equivalent to the first pressure measurement range and the electronics means further comprises means for operating on the sensor outputs such that the sensor outputs are averaged before conversion to the transmitter output.

4. The transmitter as recited in claim 1 where a maximum error level corresponds to each sensor pressure measurement range, the maximum error level increasing with widening pressure measurement ranges, and the electronics means further comprises means for operating on the sensor outputs by selecting the sensor output having the lowest maximum error level at an applied pressure for conversion to the transmitter output.

5. The apparatus as recited in claim 1 where the electronics means further comprise means for operating on the sensor outputs to substantially remove correctable errors from the sensor outputs before combining them for conversion to transmitter output.

6. The transmitter as recited in claim 1 where the transmitter output is coupled to a current loop.

7. A gauge transmitter for sensing an applied pressure, comprising:

a gauge pressure sensor having an output and a pressure inlet and sensing pressures within a first pressure measurement range;

overpressure protection means for isolating coupling the applied pressure to a volume of substantially incompressible isolator fluid and to the pressure inlet, the overpressure protection means limiting further increase in isolator fluid pressure when the applied pressure exceeds a preselected limit;

at least on additional pressure sensor sensing pressures within an additional pressure measurement range and having an additional sensor output, each additional sensor having a pressure inlet open to the volume of isolator fluid so that the overpressure protection means is shared by such pressure sensor, such pressure sensor extending the measurement capability of the transmitter; and electronics means for combining the sensor outputs for conversion to the transmitter output.

8. The transmitter as recited in claim 7 where the transmitter senses pressures within a transmitter pressure measurement range and the additional pressure measurement range extends beyond and substantially includes the first pressure measurement range, and the electronics means further comprise means for operating on the sensor outputs such that when the applied pressure exceeds pressures within the first pressure measurement range, the additional pressure output is selected for conversion to the transmitter output.

9. The transmitter as recited in claim 7 where at least one additional pressure measurement range is substantially equivalent to the first pressure measurement range and the electronics means further comprises means for operating on the sensor outputs such that the sensor outputs are averaged before conversion to the transmitter output.

10. The transmitter as recited in claim 7 where a maximum error level corresponds to each sensor pressure measurement range, the maximum error level increasing with widening pressure measurement range, and the electronics means further comprise means for operating on the sensor outputs by selecting the sensor output having the lowest maximum error level at an applied pressure for conversion to the transmitter output.

11. The transmitter as recited in claim 7 where the electronics means further comprise means for operating on the sensor outputs to substantially remove correctable errors from the sensor outputs before combining them for conversion to transmitter output.

12. The apparatus as recited in claim 7 where the transmitter output is coupled to a current loop.

* * * * *

UNITED STATES PATENT AND TRADEMARK OFFICE
CERTIFICATE OF CORRECTION

PATENT NO. : 5,022,270

DATED : June 11, 1991

INVENTOR(S) : Stanley E. Rud, Jr.

It is certified that error appears in the above-identified patent and that said Letters Patent is hereby corrected as shown below:

Col. 12, line 14, delete "on", insert --one--.

Signed and Sealed this

Tenth Day of November, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 5,022,270
DATED : June 11, 1991
INVENTOR(S) : Stanley E. Rud, Jr.

It is certified that error appears in the above-identified patent and that said Letters Patent is hereby corrected as shown below:

On the title page of the Patent, please insert the following:

Related U.S. Application Data (63) Continuation of application Ser. No. 07/365,922, June 15, 1989.

Col. 8, lines 15 and 17, delete ".35k(URL)$^{178}$", insert ".35k(URL)$^{1/2}$"

Col. 8, line 9, delete "f=k(P)$^{178}$" insert "f=k(P)$^{1/2}$"

Col. 11, delete lines 1-3

Col. 12, line 14, delete "on", insert "one"

Signed and Sealed this

Twenty-fifth Day of May, 1993

Attest:

MICHAEL K. KIRK

*Attesting Officer*  *Acting Commissioner of Patents and Trademarks*